United States Patent
Wullinger et al.

(10) Patent No.: US 8,254,005 B2
(45) Date of Patent: Aug. 28, 2012

(54) ARRANGEMENT OF MICROMECHANICAL ELEMENTS

(75) Inventors: Ingo Wullinger, Dresden (DE); Peter Dürr, Dresden (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 364 days.

(21) Appl. No.: 12/301,287

(22) PCT Filed: Jun. 3, 2006

(86) PCT No.: PCT/DE2006/000997
§ 371 (c)(1),
(2), (4) Date: Jan. 8, 2009

(87) PCT Pub. No.: WO2007/140731
PCT Pub. Date: Dec. 13, 2007

(65) Prior Publication Data
US 2009/0310204 A1    Dec. 17, 2009

(51) Int. Cl.
*G02B 26/08* (2006.01)

(52) U.S. Cl. ..................... 359/224.1; 359/904

(58) Field of Classification Search .... 359/198.1–199.4, 359/200.6–200.8, 202.1, 221.2, 223.1–225.1, 359/226.2, 290–295, 838, 846, 871, 872, 359/904; 250/204, 559.06, 559.29, 230, 250/234; 347/255–260; 353/39, 98–99; 385/15–18, 22; 398/12, 19, 45
See application file for complete search history.

(56) References Cited

U.S. PATENT DOCUMENTS

| | | | |
|---|---|---|---|
| 3,886,310 | A | 5/1975 | Guldberg |
| 5,142,405 | A | 8/1992 | Hornbeck |
| 7,092,140 | B2 | 8/2006 | Pan |
| 7,502,159 | B2 * | 3/2009 | Hagood et al. ............... 359/290 |
| 7,782,524 | B2 * | 8/2010 | Shirai et al. .................. 359/291 |

(Continued)

FOREIGN PATENT DOCUMENTS

DE         68909075 T2      4/1994
(Continued)

OTHER PUBLICATIONS

Translation of the discussion of the prior art mentioned in the International Search Report and Written Opinion for corresponding PCT application PCT/DE2006/000997.

(Continued)

*Primary Examiner* — Jennifer L. Doak
(74) *Attorney, Agent, or Firm* — Matthew B. Dernier, Esq.; Gibson & Dernier LLP

(57) ABSTRACT

The invention relates to arrangements of micromechanical elements, preferably microoptical elements, which are each held by means of spring elements. In this respect, they can be pivoted or also deflected in translation around a rotational axis by the effect of electrostatic forces. It is the object of the invention to provide an arrangement having micromechanical elements which can be operated over a long time period without drift without any frequent recalibration being necessary. The arrangement in accordance with the invention having micromechanical elements is made in this connection such that electrodes are likewise arranged beneath micromechanical elements, that is, on the side onto which no electromagnetic radiation can be directly incident. In this respect, a respective electrode is arranged and made such that it is associated with at least two micromechanical elements. It can in this connection effect a deflection of the micromechanical elements associated with it by electrostatic force effect. It is only necessary to set a suitable difference of the electrical voltage between the electrode and the respective micromechanical element for this purpose. Electrodes are arranged in the region of gaps of adjacent micromechanical elements for this purpose.

14 Claims, 1 Drawing Sheet

U.S. PATENT DOCUMENTS

| | | | |
|---|---|---|---|
| 2005/0099670 A1* | 5/2005 | Kimura et al. | 359/291 |
| 2005/0174628 A1 | 8/2005 | Kelly | |
| 2009/0033878 A1* | 2/2009 | Shirai et al. | 353/37 |
| 2009/0103158 A1* | 4/2009 | Shirai et al. | 359/221.2 |

FOREIGN PATENT DOCUMENTS

| | | | |
|---|---|---|---|
| EP | 0332953 | A2 | 9/1989 |

OTHER PUBLICATIONS

Translation of the International Preliminary Report and Written Opinion for corresponding PCT application PCT/DE2006/000997.

International Search Report and Written Opinion for corresponding PCT application PCT/DE2006/000997.

* cited by examiner

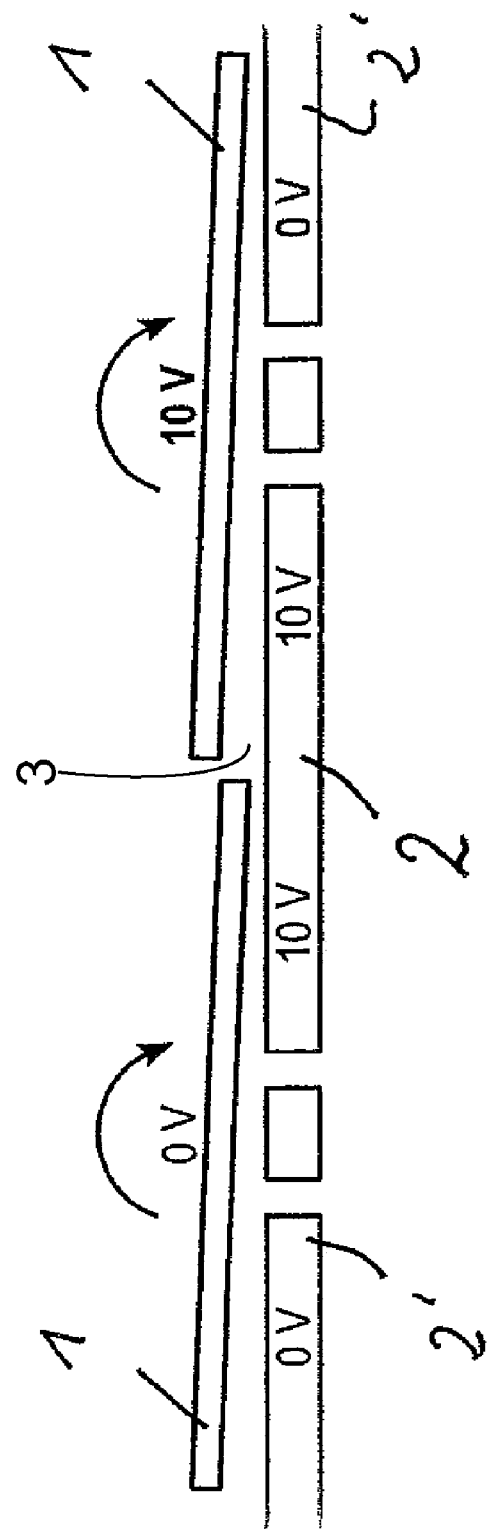

ARRANGEMENT OF MICROMECHANICAL ELEMENTS

BACKGROUND

The invention relates to arrangements of micromechanical elements, preferably microoptical elements, which are each held by means of spring elements. In this respect, they can be pivoted or also deflected in translation around a rotational axis by the effect of electrostatic forces. Electromagnetic radiation can be incident onto a surface of such microoptical elements and can be reflected from there, with the reflection being able to take place while taking account of the respective pivot angles of microoptical elements to achieve a projection of images or to form patterns for the manufacture of semiconductor structures.

For the deflection of micromechanical elements, electrodes are arranged beneath the micromechanical elements to which a presettable electrical voltage can be applied for pivoting or for deflection in translation. The deflection in this respect takes place in accordance with the respective electrostatic force and the restoring force of the spring elements. With deflected micromechanical elements, they are pivoted or deflected back into their starting position again absent any electrostatic force or with reduced electrostatic force. In these cases, the restoring force of the respective spring elements is therefore greater than the electrostatic force.

Depending on the electrical voltage, an electrostatic force can be applied which is sufficient to pivot a micromechanical element by a specific angle or to deflect it by a specific path, which can e.g. be utilized for a directed reflection of incident electromagnetic radiation. The pivoting around the rotational axis or in translation can also take place in two respectively opposite directions. The most varied images can be projected or patterns formed by corresponding pivoting of a plurality of microoptical elements of an arrangement.

The respective deflection at the desired pivot angle or path depends on the relationship of the restoring force of the spring elements and of the electrostatic force and the latter substantially depends on the electrical voltage difference between the respective micromechanical element and an electrode associated with it. A precise control is desired here to be able to observe the desired pivot angle.

A plurality of such micromechanical elements are usually used in the form of an array arrangement, with the dimensioning of the micromechanical elements being kept as small as possible. More than a million such micromechanical elements can thus be present on a chip. They can be controlled by one or more CMOS circuits which is/are arranged beneath micromechanical elements and respectively individually control the micromechanical elements with the electrodes associated with them.

Such a solution is known from U.S. Pat. No. 5,142,405. In this connection, two respective electrodes which are arranged beneath the microoptical elements are associated with each element, here microoptical element, which reflects electromagnetic radiation at a surface. The microoptical elements are held at two oppositely disposed sides by torsion spring elements which are aligned in the rotational axis around which pivoting should and can be achieved. Gaps through which electromagnetic radiation can be incident up to a substrate on which electrodes are formed are present between microoptical elements.

The individual microoptical elements can then, as already addressed, be pivoted individually by specific angles in the respective direction by control of the electrical voltage at electrodes. Electrical voltages e.g. in the range from approximately 0 to 10 V are used in this connection. An electrical voltage can thus be applied to an electrode which is arranged at a side beneath a microoptical element. The respective other electrode and the microoptical element can be switched free of voltage and can be at ground potential. However, there is also the possibility of supplying an electrical voltage to the microoptical element by means of an electrical current supply to the microoptical element so that an electrostatic force effect can be utilized for a pivoting of the microoptical element in accordance with the respective difference of the electrical voltages between the electrode and the microoptical element which results in the desired pivot angle.

In the prior art, electrodes are generally used which are associated with an individual microoptical element for its deflection.

As already indicated, electromagnetic radiation can also be incident through gaps between micromechanical elements or also a frame and micromechanical elements. This radiation can be incident onto the electrically insulating substrate and result in an electrical charging. The electrical charging increases as a result of cumulative effects over time and impairs the relationship of the effective forces. In this connection, the electrical charging takes place in regions on the substrate which are furthest away from the rotational axis around which a pivoted deflection can take place so that the force effect to be observed brings about an increased torque due to the distance to the rotational axis or to the center of mass and thus the desired force relationship of spring effect and electrostatic effect is influenced considerably. Drifts in the deflection over time thereby occur which have to be compensated in a complex and/or expensive manner or which have to be accepted.

The electromagnetic radiation incident through gaps can also induce photocurrents which can also influence deeper layers of a CMOS structure and in so doing can result in charge losses of a storage capacitor. This again impairs the electrical control of electrodes and/or micromechanical elements, which can result in unwanted changes in the respective deflection of micromechanical elements from defaults.

However, shielding with which an incidence of electromagnetic radiation can be prevented in critical regions is counterproductive since the usable angular range for a pivoting of micromechanical elements would thereby be reduced.

SUMMARY OF THE INVENTION

Starting from this, it is the object of the invention to provide an arrangement having micromechanical elements which can be operated over a long time period without drift without any frequent recalibration being necessary.

This object is solved in accordance with various embodiments of the invention by an arrangement having the features as shown and described herein. Advantageous embodiments and further developments of the invention can be achieved using the further features as shown and described herein.

The arrangement in accordance with the invention having micromechanical elements which can be pivoted or also deflected in translation around a rotational axis by the effect of electrostatic forces is made in this respect such that electrodes are likewise arranged beneath micromechanical elements, that is, on the side onto which no electromagnetic radiation can be directly incident. In this respect, a respective electrode is arranged and made such that it is associated with at least two micromechanical elements. It can in this connection effect a deflection of the micromechanical elements associated with it by electrostatic force effect. It is only necessary to set a suitable difference of the electrical voltage between the electrode and the respective micromechanical element for this purpose.

Electrodes are arranged in the region of gaps of adjacent micromechanical elements for this purpose. The surface and geometrical design of electrodes should where possible be selected such that at least 50%, preferably at least 70%, of the electromagnetic radiation which can be incident through gaps while taking account of the respective gap dimensions and of the aperture is incident onto the surface of electrodes. In this connection, the gap region between adjacently arranged micromechanical elements should be overlapped, which can be achieved by a lateral expansion of electrodes perpendicular to the alignment of a gap which takes account of the gap width and the spacing of electrode to micromechanical elements.

For the control, where possible, not only electrodes of an arrangement in accordance with the invention, but also micromechanical elements should be connected to an electrical voltage source and also be individually controllable for a direct deflection of micromechanical elements. By a defined setting of the electrical voltage at the micromechanical element, the latter can thus be directly deflected, even if the electrical voltage at the electrodes associated with it is kept constant.

Reference should be made in the following to microoptical elements as a preferred embodiment for micromechanical elements, with the embodiments naturally also being able to apply to other elements deflectable in rotation or in translation.

The respective electrodes can advantageously be arranged at the radially outer marginal region of microoptical elements, namely where the respective greatest angular deflection occurs on pivoting since the required electrical voltage can thus be kept low to be able to apply the forces required for deflection electrostatically.

In this connection, the respective electrodes can also take account of the design of outer marginal regions and/or of the alignment of rotational axes of microoptical elements associated with them. Electrodes can thus have arcuate outer marginal contours if, for example, outer margins of microoptical elements are made with concave or convex arching.

They can, however, also be matched to the geometrical design and dimensioning of angled, angular outer margins of microoptical elements.

In the invention, a respective electrode can be associated jointly with two microoptical elements whose rotational axes are aligned parallel to one another.

It is, however, also possible to associate a respective electrode jointly with two microoptical elements whose rotational axes are not aligned parallel to one another. The rotational axes can in this respect be aligned perpendicular to one another or also at an angle between 0 and 90°.

However, an electrode can also be made and arranged such that a deflection of at least three microoptical elements is made possible with it. In this respect, the microoptical elements can be pivoted around rotational axes which are not aligned parallel to one another. However, at least three microoptical elements can also be deflected by means of an electrode, at least two of which microoptical elements having rotational axes aligned parallel to one another.

It can be prevented by the invention that at least a greater portion of incident electromagnetic radiation or no incident electromagnetic radiation is incident onto the substrate and that thus an electrical charging can be reduced or completely prevented.

Charge carriers can furthermore occur between the electrodes, which are preferably also larger than in the prior art, and carriers of microoptical elements which are arranged close to the rotational axis.

The long-term stability for a direct deflection of microoptical elements on an arrangement in accordance with the invention can thus be improved or achieved.

The electrostatic force effect can be increased by the utilization of larger surface regions with electrodes. The required force for a deflection of a microoptical element can be achieved with a smaller electrical voltage.

There are no electrical fields between electrodes arranged next to one another such as have been used in the prior art and which would reduce the electrostatic force effect on the microoptical elements.

However, there is also the possibility that torsion spring elements with higher stiffness than those with a higher spring constant are used. This is possible due to the higher forces which act on microoptical elements and which can be achieved with comparable electrical parameters.

Stiffer torsion spring elements have better mechanical properties and a deformation or warpage of microoptical elements can thereby be countered. It is moreover also possible to work with higher electrical voltages without such effects.

With a preset electrical voltage, the spacing of an insulator between electrodes of adjacent microoptical elements is usually constant and cannot be further reduced to further miniaturize the microoptical elements. The relative loss of useful surface increases with smaller microoptical elements. However, these non-useful surfaces disappear or they are much smaller with the invention so that the achievable forces for the deflection of microoptical elements are larger.

The dimensioning of microoptical elements can also be reduced by the higher forces achievable with the same electrical parameters so that microoptical elements with smaller optically effective surfaces can be used since smaller microoptical elements require larger electrostatic forces for an analog deflection.

The disadvantageous influence of CMOS circuit elements which occurs in the prior art can also be avoided by the avoidance of charge effects.

All this results in a considerable improvement in the long-term stability of arrangements in accordance with the invention.

The invention will be explained in more detail by way of example in the following.

BRIEF DESCRIPTION OF THE DRAWING

There are shown:
FIG. 1, in schematic form, two microoptical elements which can be used on an arrangement in accordance with the invention.

DETAILED DESCRIPTION OF THE INVENTION

Two plate-shaped microoptical elements 1 are shown in FIG. 1. They are pivotable by presettable angular amounts around a rotational axis facing perpendicularly into the plane of the drawing and are held by torsion spring elements which are not shown and which are disposed in the rotational axis.

In addition, a plurality of electrodes 2, 2' are arranged beneath the microoptical elements 1. In this connection, a respective electrode 2 is associated with the two adjacent microoptical elements 1 and are arranged and made such that the gap 3 between adjacent microoptical elements 1 is covered by the respective electrode 2. No electromagnetic radiation with photons can thus be incident through the gap 3 onto an electrically insulating substrate not shown here.

A supply for electrical current to the individual microoptical elements 1 can be realized via additional contacts or further electrodes likewise not shown.

An electrical voltage of, for example, 10 V here can thus be applied to the microoptical element 1 shown at the right in FIG. 1, whereas the microoptical element 1 shown at the left is voltage-free, that is, 0 V is applied.

The electrode 2 which is arranged between the two microoptical elements 1 is connected to an electrical voltage of 10 V. The two electrodes 2' shown in section at the outside have a potential e.g. of likewise 0 V applied.

As shown in FIG. 1, the two microoptical elements 1 can thus be pivoted in the same direction.

However, different angular deflections of microoptical elements 1 or also different deflection directions can also be realized with different electrical voltage relationships between the microoptical elements 1 and the electrodes 2 and 2'.

Further microoptical elements not shown here can be influenced by the electrodes 2' arranged at the outside here and these electrodes 2' are likewise associated with them.

The invention claimed is:

1. An arrangement, comprising:
a plurality of micromechanical elements which are each held by means of spring elements and are pivotable around at least one rotational axis or are deflectable in translation by electrostatic force effect; and
a plurality of electrodes for an electrostatic deflection of the micromechanical elements and being arranged beneath them, wherein
a respective one of the plurality of electrodes operates to cause electrostatic deflection of at least two of the micromechanical elements that are arranged adjacent to one another.

2. An arrangement in accordance with claim 1, wherein, a surface of, and a geometrical design of, the electrode(s) are selected while taking account of gap dimensions of the adjacent micromechanical elements and of an aperture of electromagnetic radiation incident through gaps such that at least 50% of the incident electromagnetic radiation is incident onto the surface of electrodes.

3. An arrangement in accordance with claim 1, wherein the respective one of the electrodes is formed beneath a gap region between the adjacently arranged micromechanical elements, overlapping an entirety of the gap region to an extent that at least a substantial portion of incident electromagnetic radiation is prevented from being incident below the respective electrode.

4. An arrangement in accordance with claim 1, wherein micromechanical elements are also connected to an electrical voltage source.

5. An arrangement in accordance with claim 1, wherein electrodes and/or micromechanical elements for an electrostatic deflection are each individually electrically controllable.

6. An arrangement in accordance with claim 1, wherein electrodes are formed at the radially outer marginal region of micromechanical elements at which respective greatest angular deflection takes place.

7. An arrangement in accordance with claim 1, wherein a surface is optically effective at least regionally for electromagnetic radiation incident onto the surface.

8. An arrangement in accordance with claim 7, wherein the surface reflects electromagnetic radiation.

9. An arrangement in accordance with claim 7, wherein one or more of the electrode(s) is/are arranged on a side which is arranged opposite a side with an optically active surface.

10. An arrangement in accordance with claim 1, wherein the electrodes take account of a design of outer marginal regions and/or of an alignment of rotational axes of micromechanical elements associated with them.

11. An arrangement in accordance with claim 1, wherein an electrode is associated with two adjacent micromechanical elements whose rotational axes are aligned parallel to one another.

12. An arrangement in accordance with claim 1, wherein an electrode is associated with two adjacent micromechanical elements whose rotational axes are not aligned parallel to one another.

13. An arrangement in accordance with claim 1, wherein an electrode is associated with at least three adjacent micromechanical elements whose rotational axes are not arranged parallel to one another.

14. An arrangement in accordance with claim 1, wherein an electrode is associated with at least three adjacent micromechanical elements in which two rotational axes are aligned parallel to one another and one rotational axis is not aligned in parallel.

* * * * *